US010142731B2

(12) United States Patent
Goesnar et al.

(10) Patent No.: US 10,142,731 B2
(45) Date of Patent: Nov. 27, 2018

(54) DYNAMIC SUPPRESSION OF NON-LINEAR DISTORTION

(71) Applicant: DOLBY LABORATORIES LICENSING CORPORATION, San Francisco, CA (US)

(72) Inventors: Erwin Goesnar, Daly City, CA (US); David Gunawan, Sydney (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/473,200

(22) Filed: Mar. 29, 2017

(65) Prior Publication Data
US 2017/0289682 A1 Oct. 5, 2017

Related U.S. Application Data

(60) Provisional application No. 62/315,529, filed on Mar. 30, 2016.

(51) Int. Cl.
H03G 11/00 (2006.01)
H04R 3/04 (2006.01)
H04R 3/00 (2006.01)
H04R 29/00 (2006.01)
H03F 1/32 (2006.01)
H03G 5/16 (2006.01)

(52) U.S. Cl.
CPC .............. H04R 3/04 (2013.01); H03F 1/32 (2013.01); H03G 5/16 (2013.01); H04R 3/007 (2013.01); H04R 29/001 (2013.01)

(58) Field of Classification Search
None
See application file for complete search history.

(56) References Cited

U.S. PATENT DOCUMENTS 5,185,806 A  2/1993  Dolby
7,184,556 B1  2/2007  Johnson
(Continued)

FOREIGN PATENT DOCUMENTS

EP  2600636       6/2013
EP  2600636 A1 *  6/2018
(Continued)

OTHER PUBLICATIONS

Glasberg, B. et al "A Model of Loudness Applicable to Time-Varying Sounds" JAES vol. 50, Issue 5, pp. 331-342, May 2002.

*Primary Examiner* — James Mooney

(57) ABSTRACT

Systems and methods are described for dynamically suppressing non-linear distortion for a device, such as a speakerphone. A device may receive a signal, where the device has non-linear distortion at a predetermined frequency. The received signal may be analyzed to compute a tone strength parameter and a band level. The received signal may be filtered such that a spectrum of the input signal is dynamically limited by reducing suppression of the non-linear distortion when the tone strength parameter is in a lower portion of a predetermined range and increasing suppression of the non-linear distortion when the tone strength parameter is in an upper portion of the predetermined range, the predetermined range of the tone strength parameter corresponding to a loudness range of the device.

22 Claims, 12 Drawing Sheets

(56) References Cited

U.S. PATENT DOCUMENTS

| | | |
|---|---|---|
| 7,372,966 B2 | 5/2008 | Bright |
| 8,488,809 B2 | 7/2013 | Seefeldt |
| 8,577,047 B2 | 11/2013 | Gautama |
| 8,634,578 B2 | 1/2014 | Vickers |
| 8,761,415 B2 | 6/2014 | Smithers |
| 8,891,789 B2 | 11/2014 | McGrath |
| 8,976,979 B2 | 3/2015 | Crockett |
| 9,083,298 B2 | 7/2015 | Seefeldt |
| 2007/0242837 A1 | 10/2007 | Glen |
| 2008/0152168 A1 | 6/2008 | MacGrath |
| 2012/0106750 A1 | 5/2012 | Thormundsson |
| 2012/0209616 A1* | 8/2012 | Hosokawa ............. H03G 9/025 704/500 |
| 2013/0013096 A1 | 1/2013 | Seefeldt |
| 2013/0142360 A1 | 6/2013 | Potard |
| 2013/0336494 A1 | 12/2013 | Bathgate |
| 2015/0110289 A1 | 4/2015 | Bongiovi |

FOREIGN PATENT DOCUMENTS

| | | |
|---|---|---|
| JP | 08-316760 | 11/1996 |
| WO | 2014/160542 | 10/2014 |
| WO | 2015/010864 | 1/2015 |
| WO | 2015/124598 | 8/2015 |

\* cited by examiner

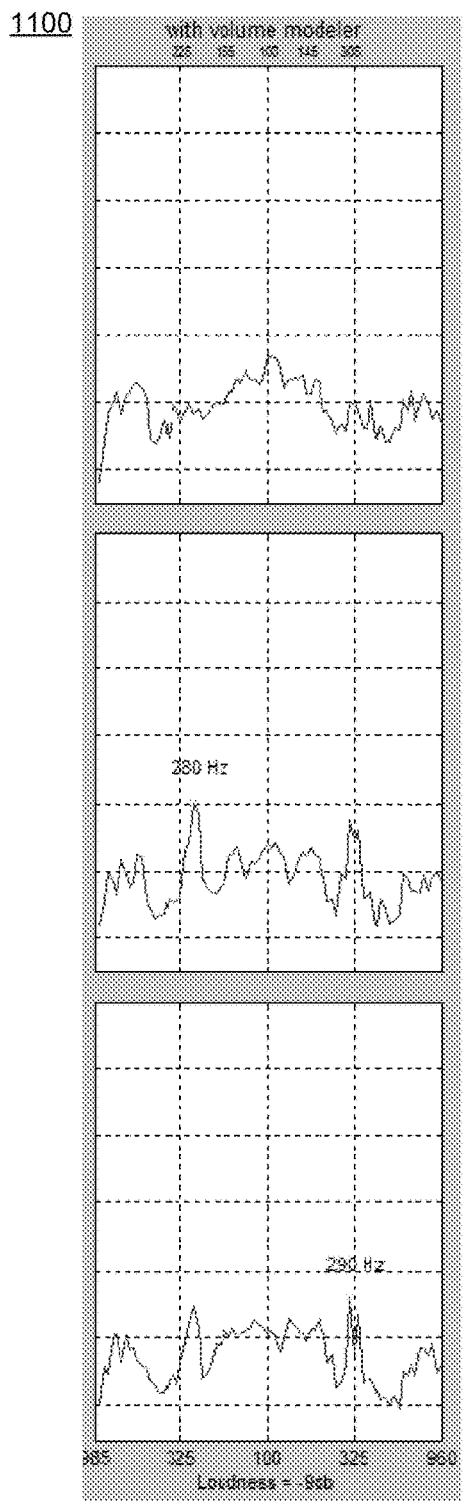 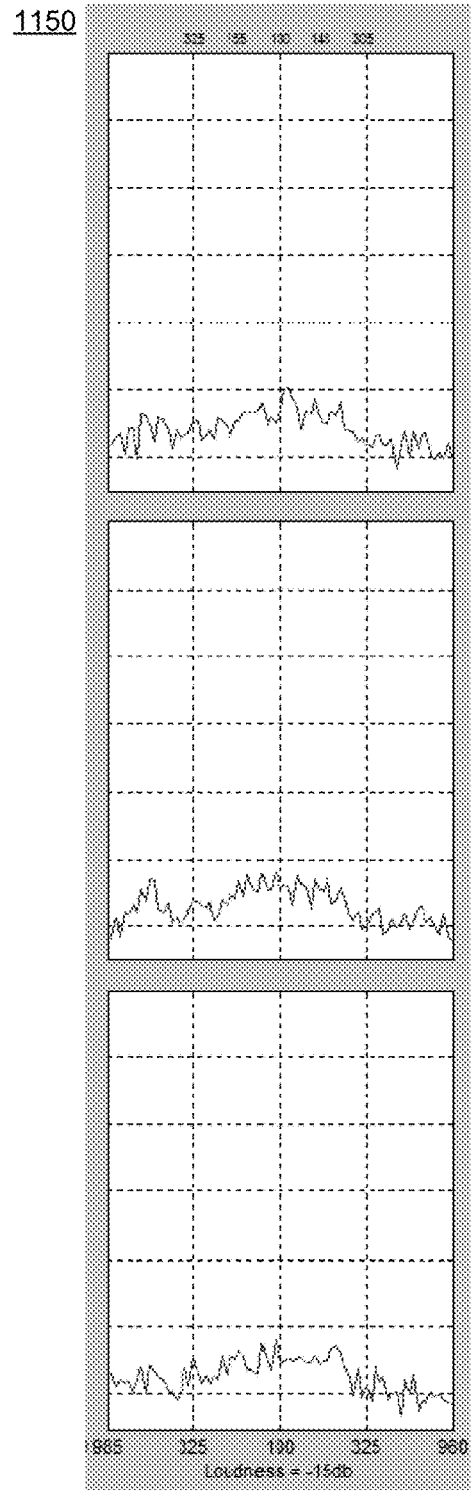
FIG. 11A  FIG. 11B

DYNAMIC SUPPRESSION OF NON-LINEAR DISTORTION

CROSS-REFERENCE TO RELATED APPLICATIONS

This application claims priority to U.S. Provisional Patent Application 62/315,529, filed on Mar. 30, 2016, which is hereby incorporated by reference in its entirety.

TECHNICAL FIELD

Embodiments herein relate generally to audio signal processing, and more specifically to dynamic suppression of non-linear distortion based on loudness.

SUMMARY OF THE INVENTION

Systems and methods are described for dynamically suppressing non-linear distortion for a device, such as a speakerphone. A multi-band limiter may receive a signal, and split the received signal into a plurality of bands. The splitting may be performed using a notch filter and a peak filter, each filter having a center frequency tuned to a predetermined frequency for the device, each filter filtering one of the plurality of bands. Both a tone strength parameter and a band level of each filtered band of the received signal may be computed by, for example, an analysis circuit coupled to the multi-band limiter. Limiter target output levels may be set for a plurality of limiters, each limiter receiving a filtered band of the received signal from a filter. Each limiter target output level may be set such that suppression of the non-linear distortion is reduced when the tone strength parameter is in a lower portion of a predetermined range and suppression of the non-linear distortion is increased when the tone strength parameter is in an upper portion of the predetermined range. The predetermined range of the tone strength parameter may correspond to a loudness range of the device.

The multi-band limiter may then limit the output of each filter by each of the limiters based on the set limiter target output levels. The outputs of each of the limiters may be combined to provide a processed signal as an output of the multi-band limiter. In an embodiment, the target output level for each limiter may be set by computing mapping parameters to map the computed tone strength parameter to the limiter target output level based on the computed band level and the computed tone strength. Additional embodiments may include filtering an input signal by a shelf filter prior to the multi-band limiter processing, and using a test procedure to determine one or more predetermined frequencies for the device having a peak level of harmonic distortion.

BRIEF DESCRIPTION OF THE FIGURES

This disclosure is illustrated by way of example and not limitation in the figures of the accompanying drawings, in which like references indicate similar elements, and in which:

FIGS. 11A-11B show plots describing levels of harmonic distortion for a device at −15 and −9 DB using a system for dynamic suppression of non-linear distortion for the device.

DETAILED DESCRIPTION

The audio quality of certain audio devices, such as speakerphones, typically degrades as the speaker volume increases. At loud volume level, overtone or even buzzing may be heard on the receive end of the device. In the addition, for a duplex system, the far end might either hear occasional echo leakage or hear heavily suppressed voice of near end talker when the non-linear distortion of the speaker is high depending on the setting of the echo suppressor.

To reduce the distortion, conventional solutions apply notch filters or limiters to suppress the audio at the resonant frequencies of the system where the distortions are high. However, these techniques have shortcomings. Notch filters also suppress the audio at lower loudness levels, where the non-linear distortion is low. Suppressing the audio at lower loudness levels may degrade the audio quality when such suppression is unnecessary. Conversely, the amount of suppression of a limiter can be very aggressive for loud signals. Unduly aggressive suppression caused by a limiter may unnecessarily degrade the audio quality if significant limiting is used to suppress problematic frequencies for a signal with mid-level loudness.

The proposed solution described herein preserves audio quality by analyzing playback signals to dynamically shape, attenuate or limit the spectrum of the loudspeaker signals of the device in accordance with the amount of non-linear distortion present. Accordingly, the described solution preserves the timbre and reduces non-linear distortion of the device, without unduly suppressing the underlying audio signal being played on the loudspeaker.

Figure 1:
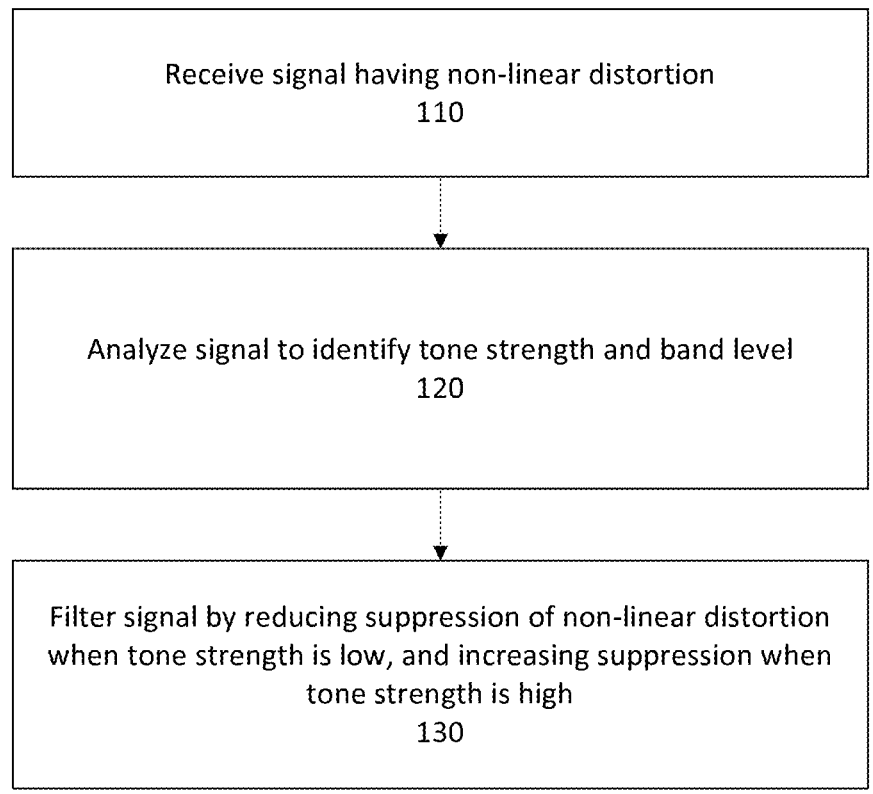
FIG. 1 shows a flow diagram for a method providing dynamic suppression of non-linear distortion for a device, according to an embodiment.
Figure 2:
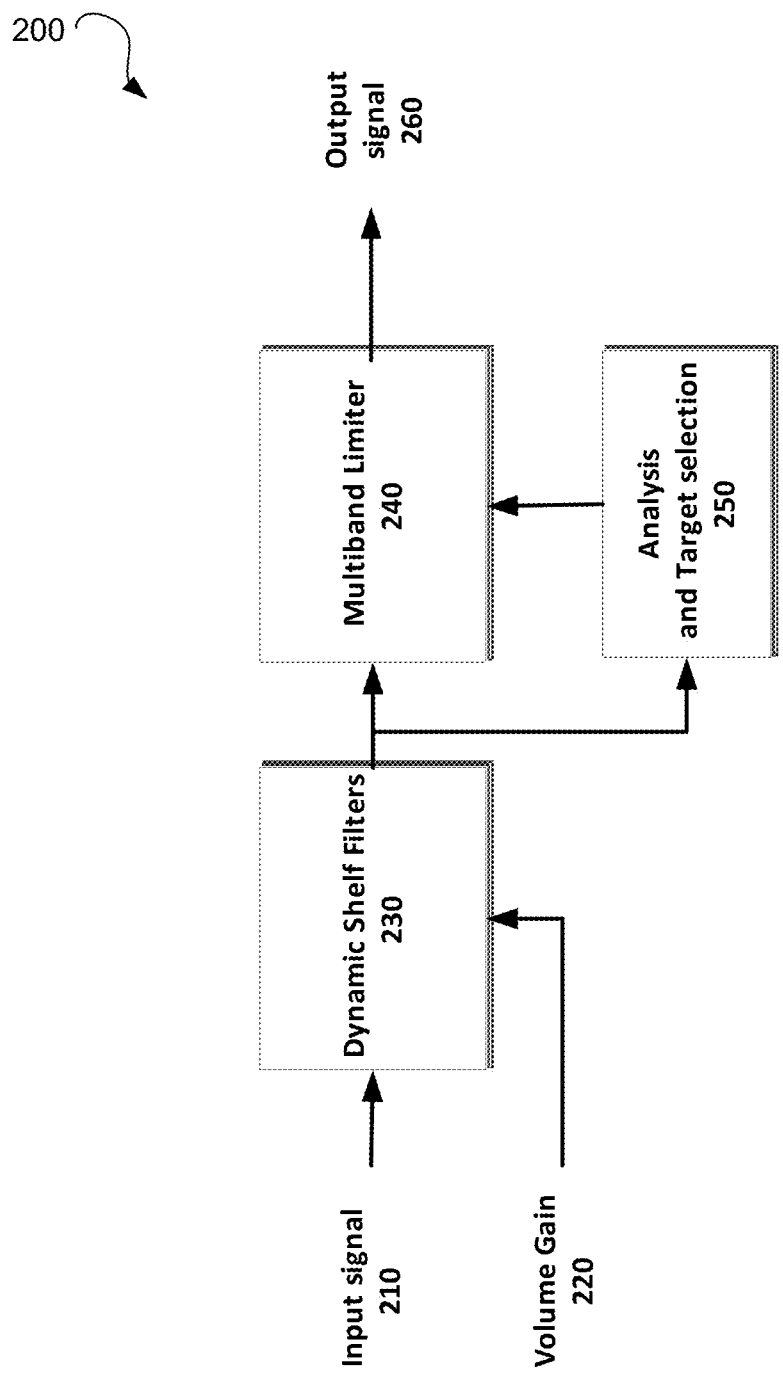
FIG. 2 shows a simplified block diagram of a system providing dynamic suppression of non-linear distortion for a device, according to an embodiment.

FIG. 1 shows a flow diagram for method 100 providing dynamic suppression of non-linear distortion for a device, under an embodiment. Using method 100, the speaker output signal of an audio device (such as a speakerphone) is controlled to reduce the non-linear distortion for improving duplex performance and consistent timbre may be provided at various device volume levels. FIG. 2 shows a simplified block diagram of a volume modeling system 200 providing dynamic suppression of non-linear distortion for a device, according to an embodiment, using the method 100 described in FIG. 1. The exemplary volume modeling system 200 includes dynamic shelf filters 230, multi-band limiter circuit 240 and analysis and target selection circuit 250. The multi-band limiter 240, as is described in further detail below, may be designed to prevent or reduce the occurrences of non-linear distortion on the captured signal during audio playback.

In method 100, a signal may be received on a device at step 110, the device having non-linear distortion effects at a pre-determined frequency. The signal may be any suitable audio signal, and the device may be any audio device having a speaker, such as a mobile telephonic device having a speaker phone function, or a dedicated speaker phone. The device may include the exemplary volume modeling system 200, for example. While not required in all embodiments, dynamic shelf filters 230 may be designed to preserve the timbre as the volume level changes.

Figure 3:
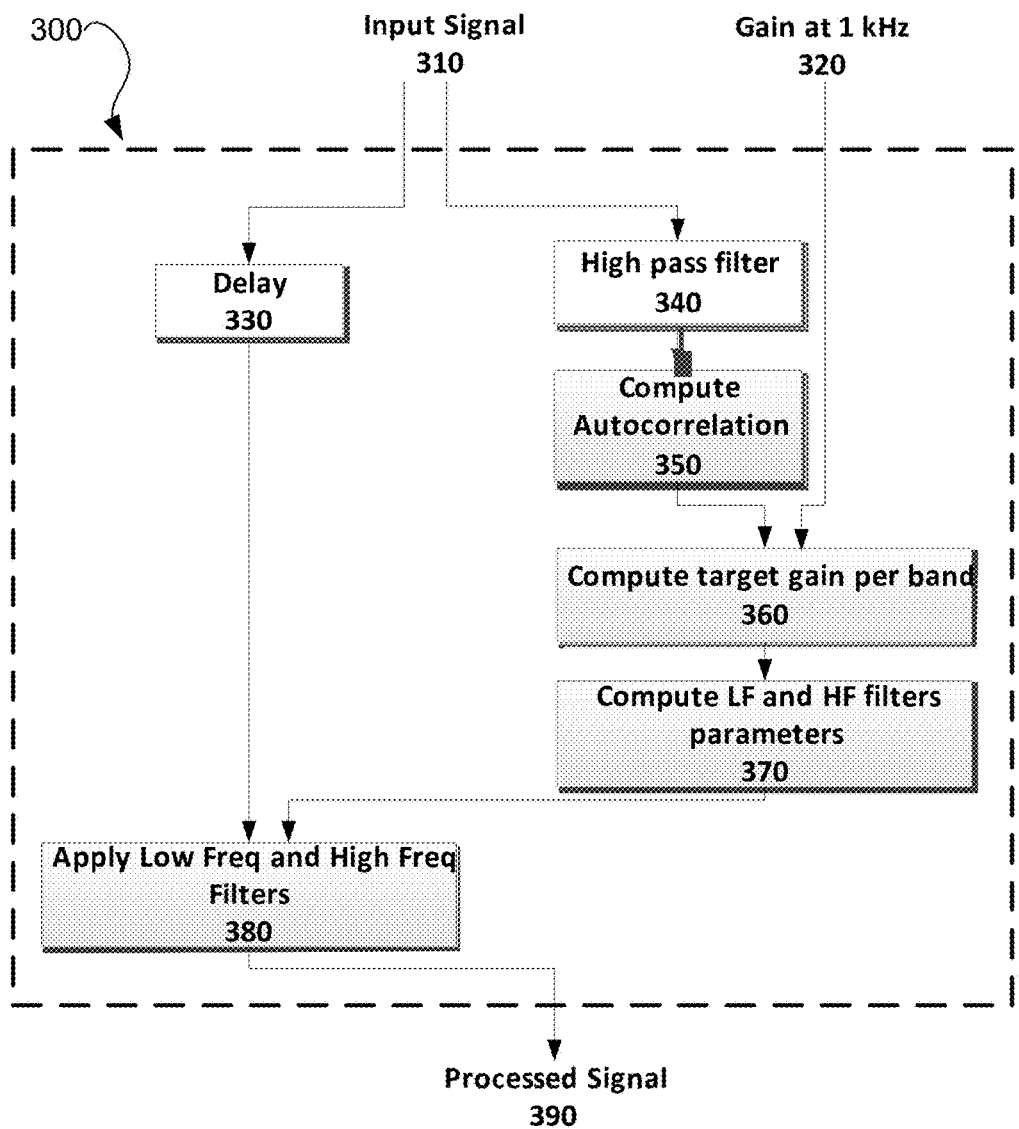
FIG. 3 shows a simplified block diagram of a dynamic shelf filter, according to an embodiment.

FIG. 3 shows a simplified block diagram of a dynamic shelf filters 300, according to an embodiment. The received input signal 310 and a desired volume gain level (shown at the predetermined frequency of 1 kHz in FIG. 3; however the desired volume gain may be set at any desired predetermined frequency) may be received as inputs to the dynamic shelf filter 300. The input signal may have a loudness parameter corresponding to a loudness level of the received audio signal 310. The desired gain may be equal to a desired loudness change of the loudness parameter, and may be set by a user, for example. The received signal 310 may be processed by passing through a high pass filter 340. An autocorrelation is computed at analysis block 350 The autocorrelation may be used to measure the power spectral density of the input signal around the anchor bands, and analysis block 350 may output band levels for each of the bands of the input signal. Based on the loudness parameter of the input signal 310, the volume gain 320, and the computed band levels from autocorrelation 350, a target gain per band may be computed at block 360 and filter parameters may be computed at block 370. In a signal path of dynamic shelf filters 300, the signal may be delayed at block 330 while the processing steps are taking place. In response to the filter parameters being computed, low and high shelf filters may be applied at block 380 to the output signals to preserve the timbre. A the loudness parameter of the input signal 310 increases, the dynamic filters 380 may attenuate the low frequency and the high frequency bands. On the other hand, when the loudness parameter decreases, the filters 380 may boost the low frequency and high frequency bands. Note that this processing was originally designed to preserve timbre for audio playback device but this also helps in controlling echo at higher volume when reducing the low frequency to preserve timbre. The output of the dynamic shelf filters 390 may be the signal received by the multi-band limiter 240.

Returning to FIG. 1, the received signal may be analyzed to identify a tone strength parameter and a band level of the received signal at step 120. Step 120 may be handled by the analysis and target selection circuit 250, which may be external to multi-band limiter 240 (as shown in FIG. 2) or may be internal to the multi-band limiter 240 in some embodiments. The multi-band limiter 240 may then filter the received signal such that the spectrum of the input signal is dynamically limited at step 130. That is, suppression of the non-linear distortion may be reduced by the multi-band limiter 240 when the tone strength parameter is in a lower portion of a predetermined range and suppression of the non-linear distortion may be increased when the tone strength parameter is in an upper portion of the predetermined range. The predetermined range of the tone strength parameter may correspond to a loudness range of the device, where the lower portion corresponds to a lower volume audio signal and the upper portion corresponds to a higher volume signal.

Figure 4:
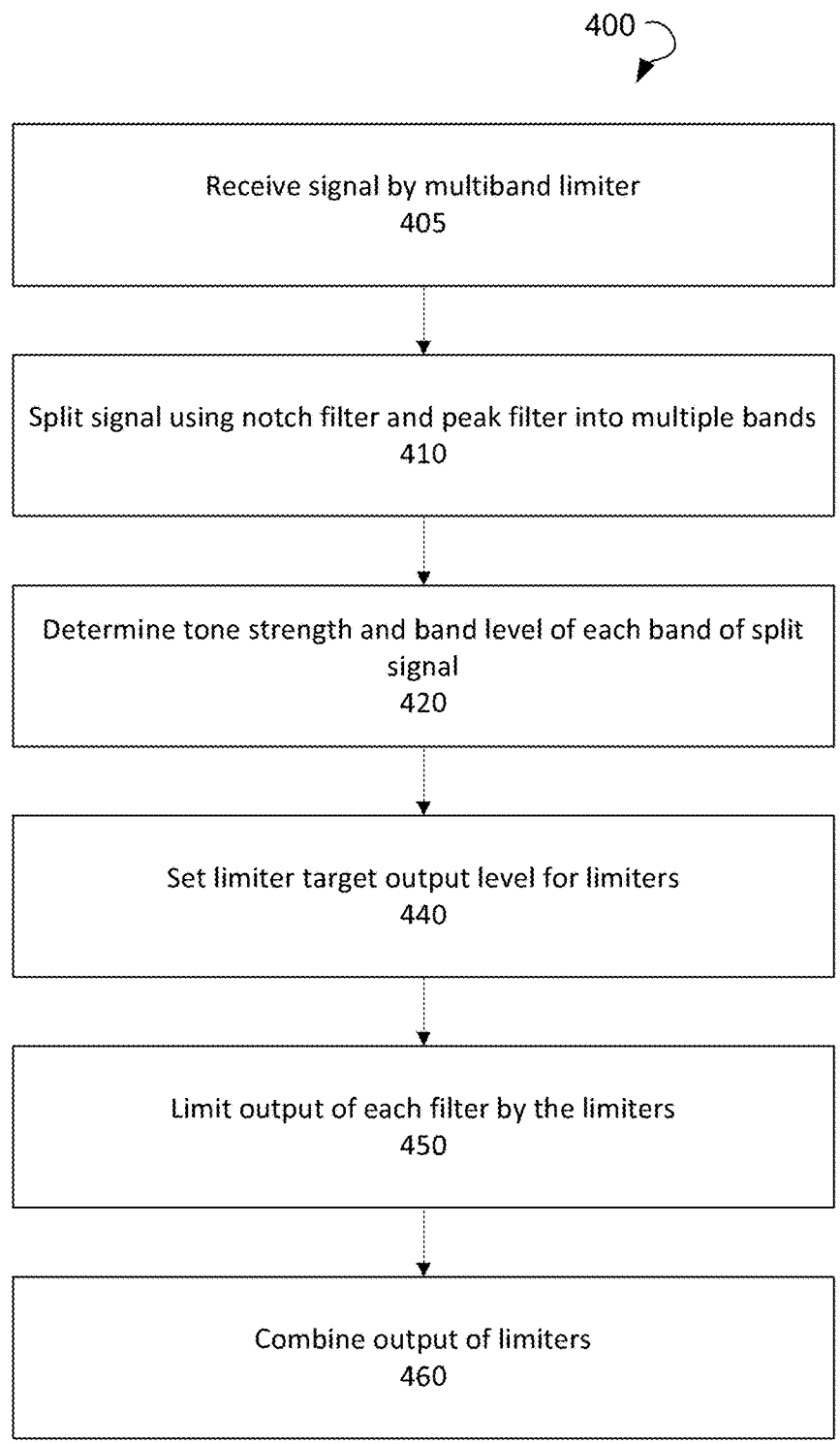
FIG. 4 shows a flow diagram for a method providing dynamic suppression of non-linear distortion for a device by a multi-band limiter, according to an embodiment.
Figure 5:
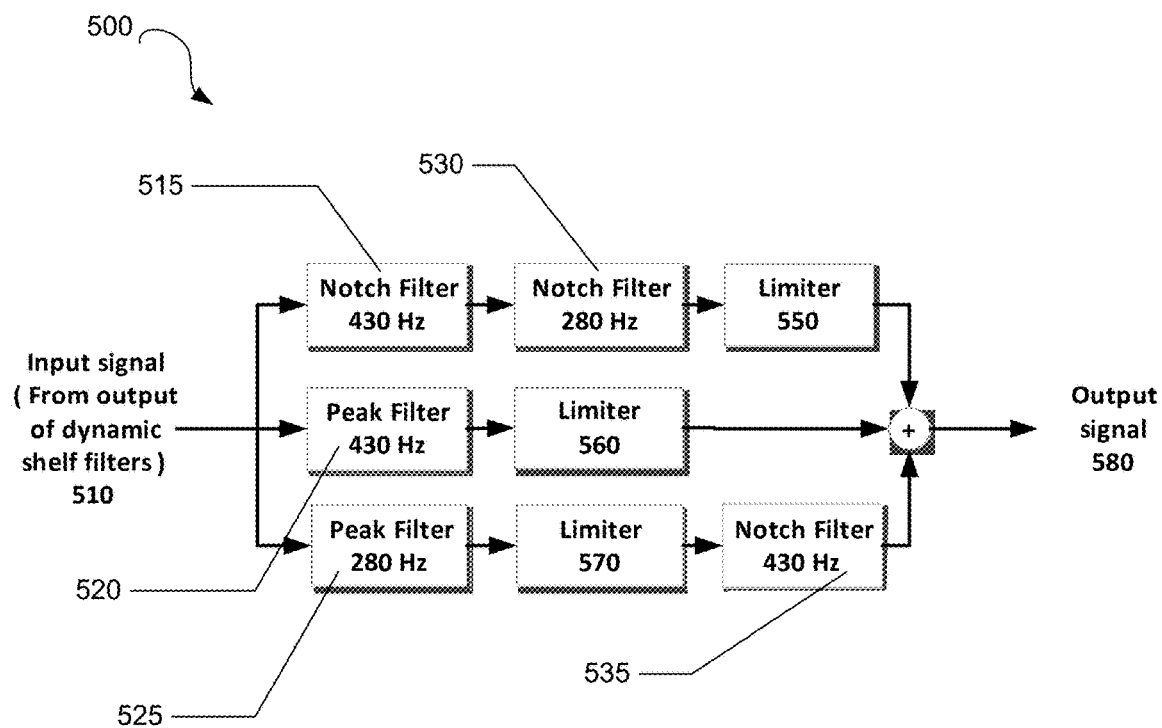
FIG. 5 shows a simplified block diagram of a multi-band limiter that provides dynamic suppression of non-linear distortion for a device, according to an embodiment.

FIG. 4 shows a flow diagram for a method 400 of providing dynamic suppression of non-linear distortion for a device by a multi-band limiter, according to an embodiment. FIG. 4 provides a more detailed description of an embodiment of the multi-band limiter 240 described above. FIG. 5 shows a simplified block diagram of a multi-band limiter 500 that provides dynamic suppression of non-linear distortion for a device, according to an embodiment. While the multi-band limiter may only filter on one predetermined frequency, the multi-band limiter 500 filters on two predetermined frequencies, 430 Hz and 280 Hz, using two pairs of notch filters and peak filters. The first notch-peak pair (515 and 520 respectively) filter at 430 Hz, while the second notch-peak pair (530 and 525 respectively) filter at 280 Hz. Multi-band limiter 500 also includes three limiters 550, 560, and 570.

According to method 400, a signal 510 is received by the multi-band limiter. As shown in FIG. 5, the signal may be the output of dynamic shelf filters, such as dynamic shelf filters 300. The received signal is split, by the multi-band limiter 500, into a plurality of bands using a notch filter and a peak filter at step 410 (e.g., notch filter 515 and peak filter 520). Each filter may have a center frequency tuned to a predetermined frequency for the device, where each filter filters one of the plurality of bands. In an embodiment, the notch and peak filters are bi-quad filters. While a single center frequency may be used for the multi-band limiter, multi-band limiter 500 utilizes two center frequencies, 430 Hz and 280 Hz. Furthermore, in multi-band limiter 500, the splitting of the received signal is done by splitting the received signal into three bands using two notch filters 515 and 530 paired with two peak filters 520 and 525. In an embodiment, the response of the sum of peak and notch filters for a given predetermined frequency may equal one (meaning perfect reconstruction of the received input signal 510). The center frequencies of the notch or peak filters may be tuned to the frequencies which need limiting. An exemplary process of identifying which frequencies to limit is described below.

Each notch filter and peak filter pair may be set to a predetermined frequency, where both notch filters 515 and 530 filter a single band, and each peak filter 520 and 525 filters a separate band. The notch filters 515 and 530 each remove a component from the received signal that may trigger non-linear distortion, and output bands of the signal without the components that may trigger non-linear distortion. Conversely, the peak filters 520 and 525 extract the peaks of the input signal that include the components from the received signal that may trigger non-linear distortion. The peak filters 520 and 525 accordingly may output only the components of the received signal that may trigger non-linear distortion.

Multi-band limiter 500 includes three limiters 550, 560, and 570, each limiter limiting a separate band. In an embodiment, limiter 550 may apply light filtering to the band received from the output of notch filter 530 by having a target output level set to a constant value, such as a headroom of the device (e.g., −3 dbFS). Also in an embodiment, the limiter targets of limiters 560 and 570 may be dynamic and may be set, for example, based on the tone strength of the band received by limiters 560 and 570 respectively from the peak filters. By controlling the limiter targets of limiters 560 and 570, the amount of suppression of the distortion component may be dynamically adjusted, and the adjustment of the amount of suppression may be done with minimal latency. The computation of the limiter targets of limiters 560 and 570 is discussed in further detail below.

As shown in FIG. 5, the output of limiter 570, which limits the output of peak filter 525, may also be filtered by optional notch filter 535 at 430 Hz. Notch filter 535 may be the same filter as notch filter 515 or may be separately implemented. Notch filter 535 advantageously filters the peak at 280 Hz of the received signal, allowing more precise limiting around the 280 Hz non-linear distortion peak without affecting the higher frequencies of the received signal. If the quality factor (Q factor) of the notch and peak filters are high and the center frequencies being filtered have a relatively large difference, then the amount of leakage between the bands may be relatively small. In such a scenario, notch filter 535 may not make a significant difference in the limiting, and may therefore be omitted.

The coefficients of the notch and peak filters may be computed in an exemplary embodiment using the code shown below. Using the bi-quad filters described below may advantageously reduce processing overhead in performing the filtering of the received bands.

```
function [b,a] = biquadNotch(w0,bw0)
% Design biquad notch filter
    bw0 = bw0*pi;
    w0  = w0*pi;
    beta = tan(bw0/2);
    gain = 1/(1+beta);
    b   = gain*[1 -2*cos(w0) 1];
    a   = [1 -2*gain*cos(w0) (2*gain-1)];
end
function [b,a] = biquadPeak(w0,bw0)
% Design biquad peak filter
    bw0 = bw0*pi;
    w0  = w0*pi;
    beta = tan(bw0/2);
    gain = 1/(1+beta);
    b   = (1-gain)*[1 0 -1];
    a   = [1 -2*gain*cos(w0) (2*gain-1)];
end
```

While biquad filters are described above, other filter definitions may be used to define a filtering scheme prior to applying the limiters of the multiband limiter. For example, another approach would be to use a filter bank to split the received signal into multiple bands in the frequency domain. Using a filter bank may be disadvantageous to the biquad notch and peak filters described above, however, since the filter bank may have higher complexity and higher delay.

Returning to FIG. 4, both a tone strength parameter and a band level of each filtered band of the split received signal are computed at step 420. This may be done, for example, by measuring the energies of the peak and notch filter output signals. The tone strength parameter may be defined as a ratio of the energies of the peak and notch filter output signals (e.g., peak filter output signal energy divided by notch filter output signal energy for filters at the same center frequency), and the band level may be equal to the energy of the peak filter output signal. Using the computed tone strength parameter and band level for each band, limiter target output levels for the plurality of limiters may be set at step 440. As shown in FIG. 5, each limiter 550, 560, and 570 receives a filtered band of the received signal from a filter. Each limiter target output level may be set such that suppression of the non-linear distortion is reduced when the tone strength parameter is in a lower portion of a predetermined range and suppression of the non-linear distortion is increased when the tone strength parameter is in an upper portion of the predetermined range. The predetermined range of the tone strength parameter may correspond to a loudness range of the device. When the tone strength is low, the amount of signal outside of the problematic frequency may be fairly strong. The distortion is most likely masked by the clean signal so the user would not hear much of the distortion on the playback, making it desirable to have less suppression of the non-linear distortion. Moreover, since there is strong energy on the reference signal outside the problematic frequency, an echo suppressor can typically suppress the non-linear echo. Hence the amount of suppression can be reduced as the tone strength decreases.

Figure 6:
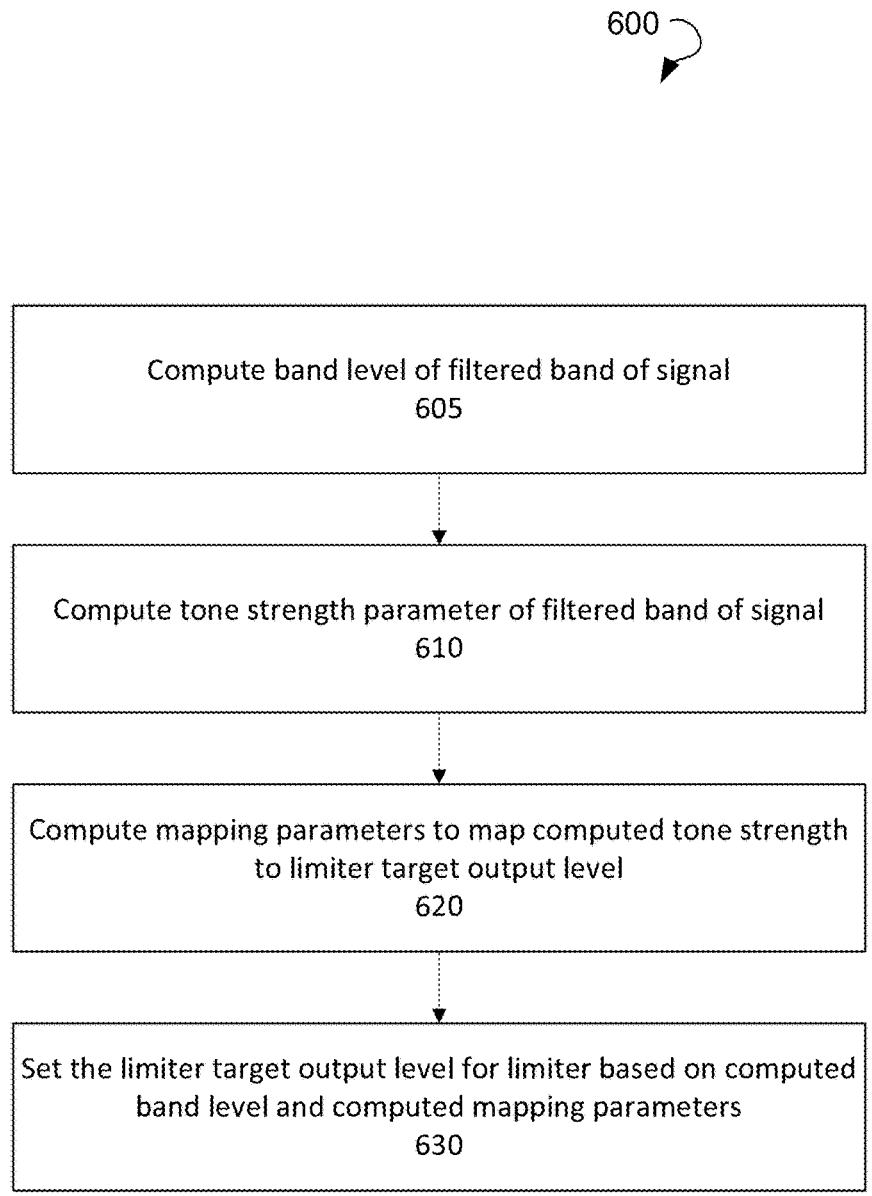
FIG. 6 shows a flow diagram for a method for setting limiter targets within a multi-band limiter, according to an embodiment.
Figure 7:
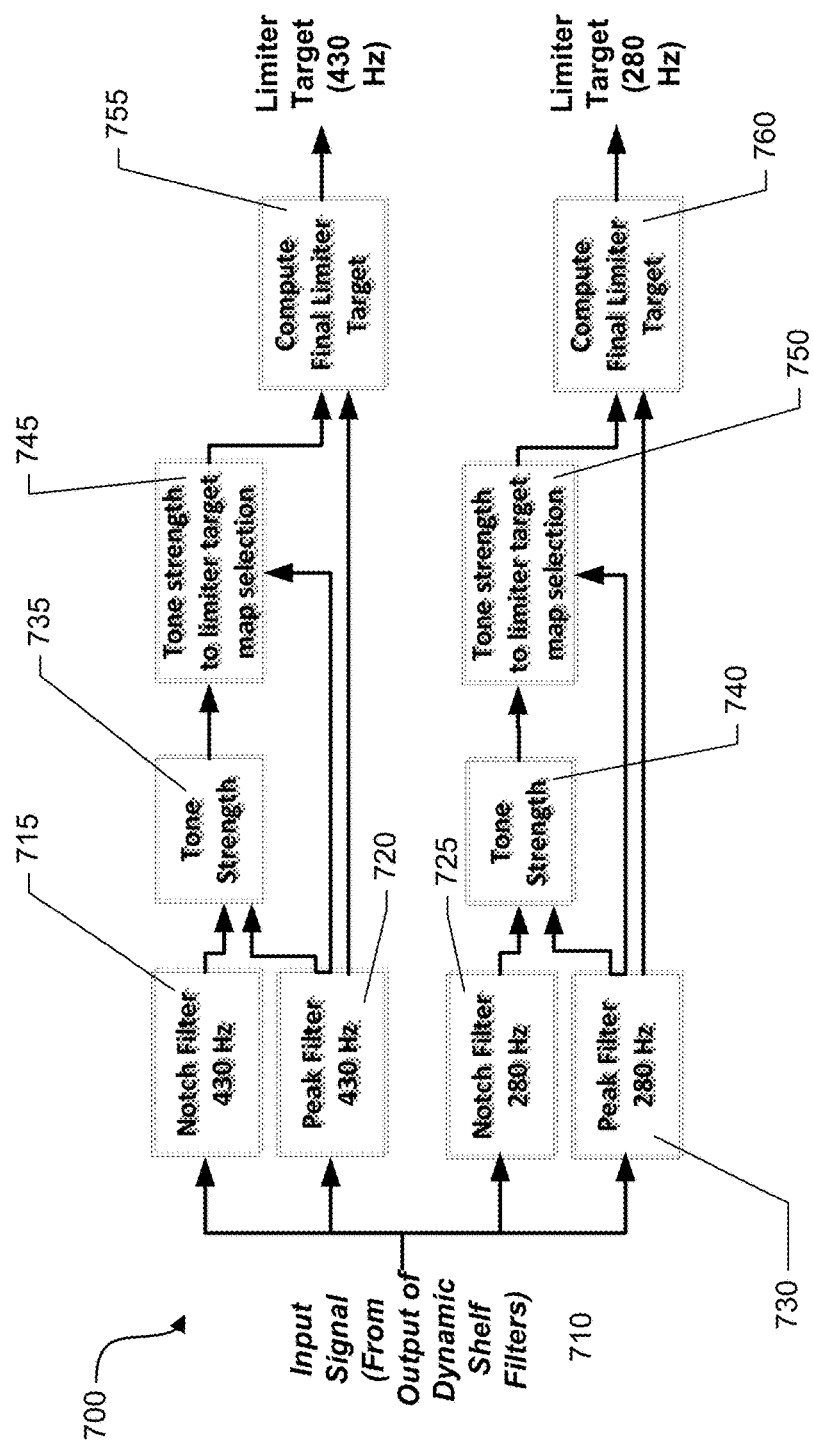
FIG. 7 shows a simplified block diagram illustrating setting of limiter targets within a multi-band limiter, according to an embodiment.

The targets of the limiters around the notch frequencies may depend of the tonal strength of the input signal as well as the band levels around the notch center frequencies. FIG. 6 shows a flow diagram for a method 600 for setting limiter targets within a multi-band limiter, according to an embodiment. FIG. 7 shows a simplified block diagram 700 illustrating setting of limiter targets within a multi-band limiter, according to an embodiment. The setting of limiter targets may be performed by, for example, the analysis circuit 250 of FIG. 2.

First, the band levels, which may be defined as the energies of the output of the peak filters 720 and 730 at a given center frequency (e.g., 430 Hz and 280 Hz respectively), may be computed for each band at step 605. The tone strength parameters, where the tone strength may be defined as the ratio of the energies of the peak and notch filter outputs at a given center frequency, may be computed at step 610. In FIG. 7, this is displayed by block 735 for the center frequency 430 Hz and block 740 for the center frequency 280 Hz. Based on the computed band levels and the computed tone strength parameters, the parameters for mapping the tone strength to limiter target output level may be computed at step 620.

The mapping function for the limiter target output levels may be computed in block 745 for the 430 Hz center frequency and block 750 for the 280 Hz center frequency. The mapping function for the limiter target output level of each limiter may be determined by measuring the distortion of the device to estimate the amount of suppression needed to reduce the distortion. The input parameters to the mapping function may be the computed tone strength parameter and the band level of the band at the center frequency being filtered. For the example in FIG. 7, since there are two frequencies being targeted for suppression, there may be two independent corresponding mapping functions computed. The mapping functions may be selected such that, as the band level for a band increases, the mapping function will be more aggressive (i.e. a smaller value of the tone strength parameter is needed to produce larger limiter output target level) to create limiting on wider frequencies. This may be done, for example, by selecting mapping parameters that vary in direct proportion to the computed band level of the filtered band.

The limiter target output level for each limiter may be set based on the computed band level and the computed mapping parameters at step 630. This is done in block 755 for the 430 Hz center frequency and block 760 for the 280 Hz center frequency. In an embodiment, the mapping function may set the limiter output target level to equal "−bandLevel+headroom+depth" in decibels. That is, the limiter target output level for each limiter being equal to a sum of the negation of the computed band level of the filtered band, a predetermined headroom value, and a depth parameter, the depth parameter falling within a predetermined range and being related to the computed band level of the filtered band. The depth parameter may depend on the band level of the filtered band of the signal received by the limiter, which may vary in a predetermined range from minDepth to maxDepth. For high band level filtered bands (e.g., >=−3 decibels relative to full scale [DBFS]) and low band level filtered bands (e.g., <=−9 dBFS), the depths parameters may be set to maxDepth and minDepth respectively. For other band levels of the filtered band (e.g., a band level between −9 dBFS and −3 dBFS), the depth parameter may be set linearly between maxDepth and minDepth in an exemplary embodiment. The headroom may be a constant value, such as 3 dB, for example.

Returning to FIG. 4, the multi-band limiter may limit the output of each filter by each of the limiters based on the set limiter target output levels at step 450. Signals below the set limiter target output level may be allowed to pass, while signals above the set limiter target output level may accordingly be attenuated. At step 460, the outputs of each of the limiters may be combined, thereby providing a processed signal as an output of the multi-band limiter.

Figure 8A:
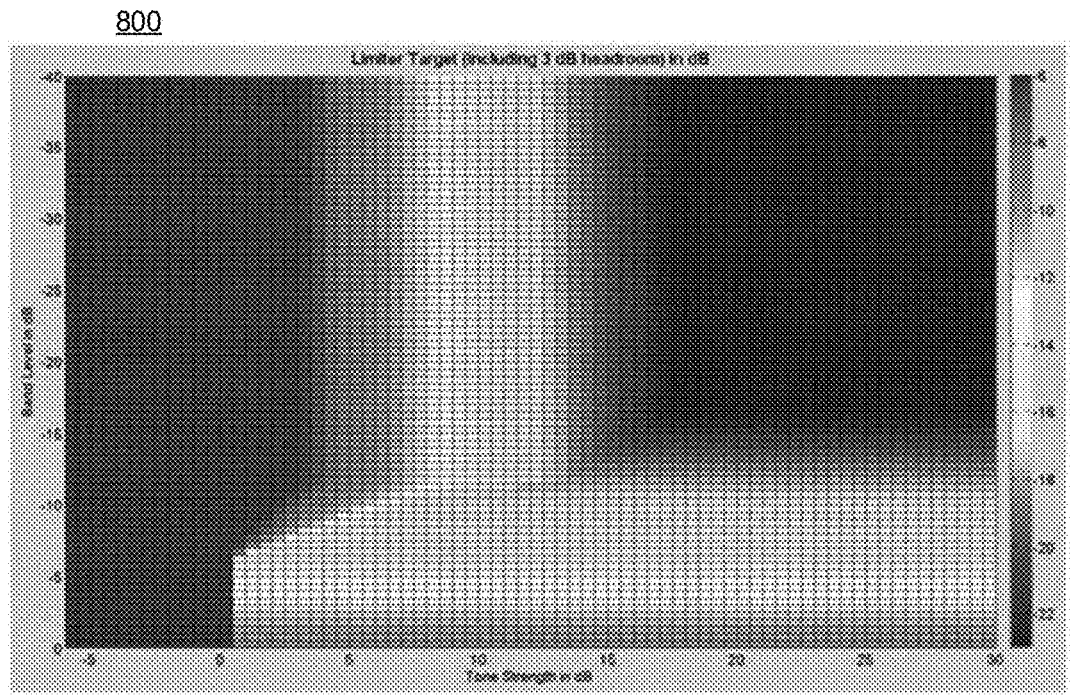
FIGS. 8A-8B show plots describing a mapping function of a multi-band limiter that provides dynamic suppression of non-linear distortion for a device and the resulting suppression provided by the multi-band limiter respectively.
Figure 8B:
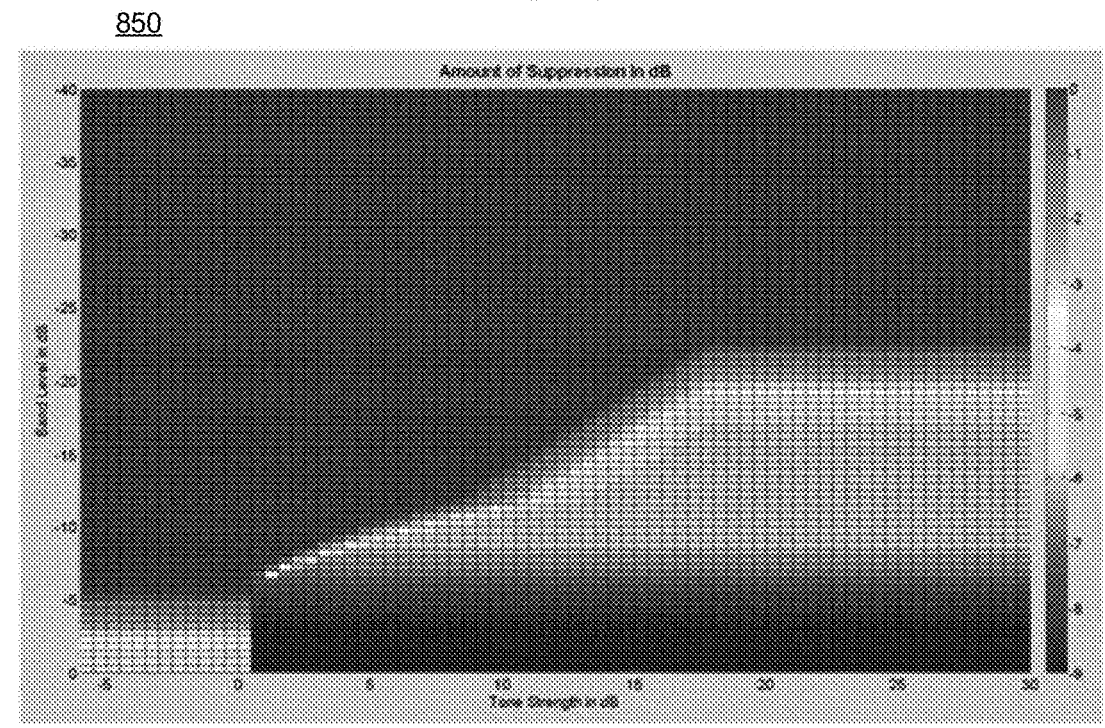

FIGS. 8A-8B show plots describing a mapping function of a multi-band limiter of set points that provides dynamic suppression of non-linear distortion for a device and the resulting suppression provided by the multi-band limiter respectively. The set points are the limiter target values derived via the mapping function. Plot 800 illustrates an example of the operation of a mapping function based on the embodiment described above, with a headroom of 3 dB. The input of the mapping function displayed in plot 800 may be the band level and the tone strength parameter of the received band, as described above. Plot 800 illustrates that at low tone strengths, the mapping function causes the limiter target to be set to the lower end of the spectrum to the right of plot 800 (i.e., −6 to −10 dB). However, as the tone strength increases (corresponding to an increase in loudness), suppression becomes increasingly aggressive. This is shown in the top right area of plot 100, where the tone strength is above 15 dB. In this upper region of the tone strength range, the limiter target is set to the higher end of the spectrum, approximately 20-22 dB. Plot 850 displays the resulting suppression at a center frequency being filtered, for given values of the band level and the tone strength parameter of the band of the input signal received by a limiter of the multi-band limiter. As plot 850 illustrates, the suppression provided by the limiter increases as tone strength and/or band level increases for the received band of the input signal.

Figure 9:
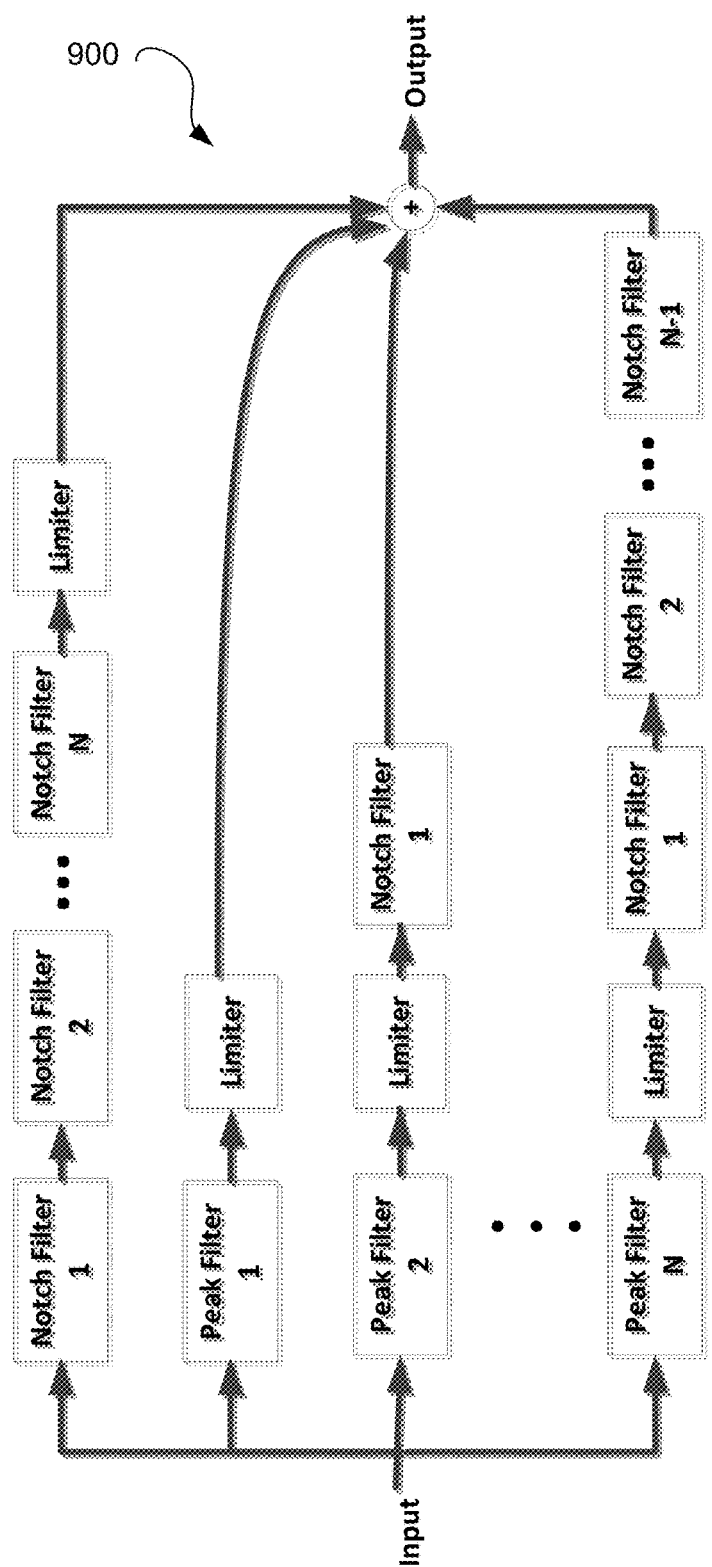
FIG. 9 shows a block diagram shows a simplified block diagram of a multi-band limiter that provides dynamic suppression of non-linear distortion for a device.

While the exemplary multi-band limiters shown in FIGS. 4-7 are for two center frequencies, the present invention is not limited in this regard and may have as many center frequencies as desired. FIG. 9 shows a block diagram shows a simplified block diagram of an exemplary multi-band limiter 900 that provides dynamic suppression of non-linear distortion for a device, the multi-band limiter 900 having an arbitrary number of bands N. As multi-band limiter 900 shows, the splitting the received signal may include splitting the received signal into a plurality of bands using N notch filters paired with N peak filters, wherein N is greater than two. Each notch filter and peak filter pair may be set to a predetermined center frequency. In multi-band limiter 900, the N notch filters filter a single band, and each peak filter filters a separate band of the received signal. The multi-band limiter 900 also includes N limiters, each limiter limiting a separate band received from a peak filter in the manner described above (e.g., using a computed target output value derived using a mapping function).

Figure 10A:
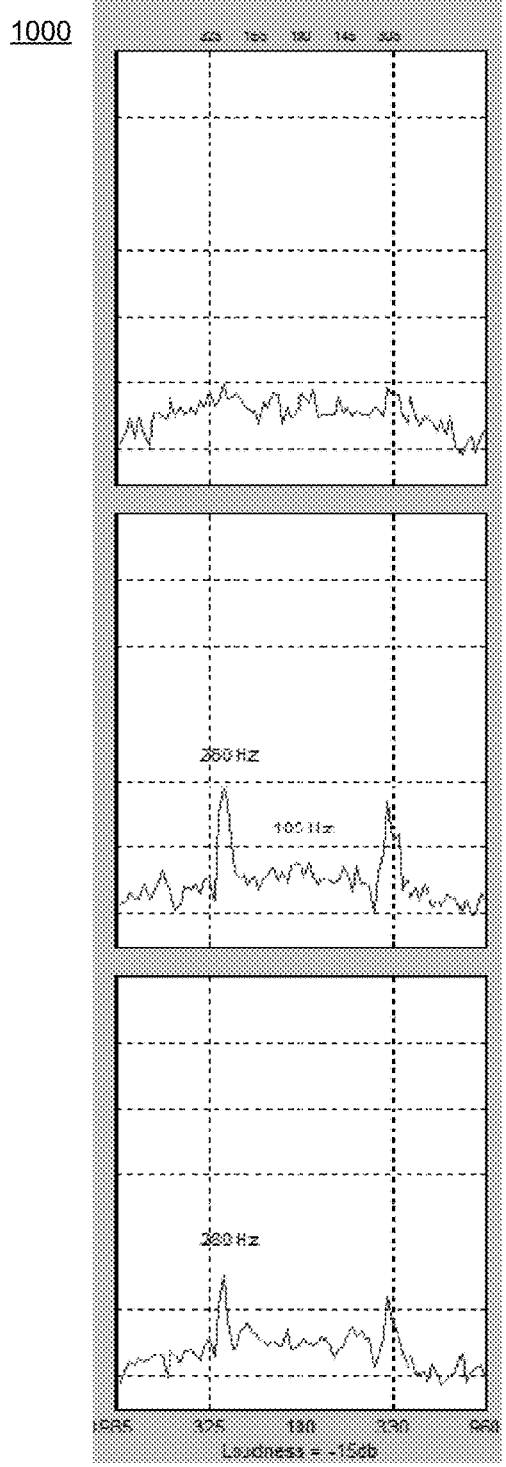
FIGS. 10A-10B show plots describing levels of harmonic distortion for a device at −15 and −9 DB.
Figure 10B:
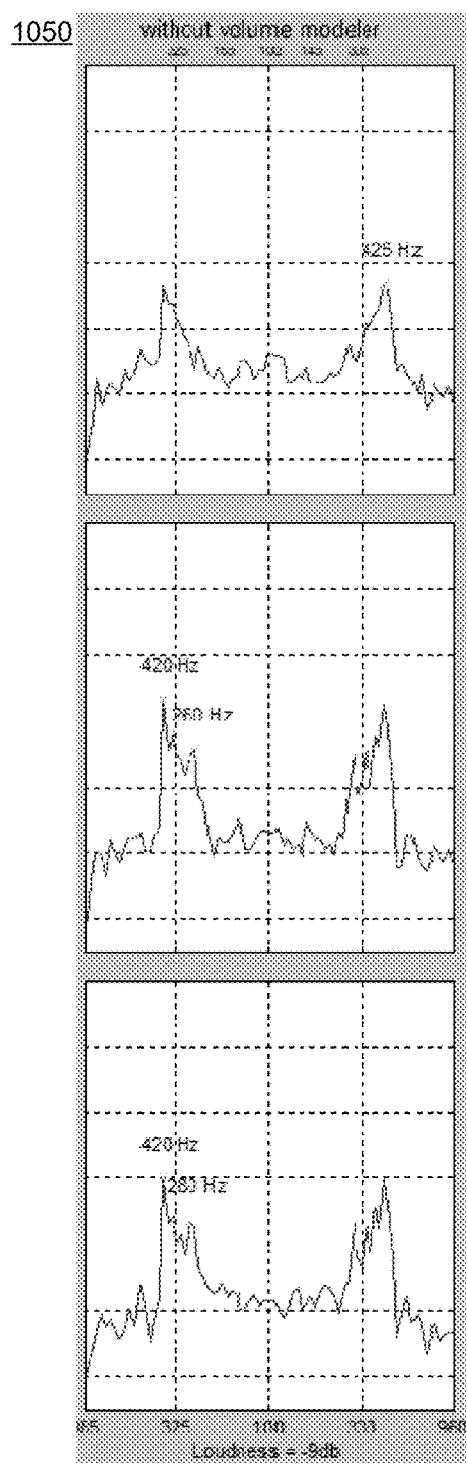

To find problematic frequencies for a particular device to dynamically suppress the non-linear distortion in incoming and outgoing signals from the device, many suitable methods may be used. One such method may be to play swept tones from a predetermined frequency range (e.g., 100 Hz to 1 kHz) at different tone strengths (e.g., from −3 dBFS to −18 dBFS) on the device, and record the output signal. The levels of the harmonic distortion of the captured output signal may be recorded for each played swept tone. One or more frequencies within the predetermined frequency range may be identified where recorded levels of harmonic distortion have a peak. FIGS. 10A-10B show plots 1000 and 1050 describing levels of harmonic distortion for a device at −15 dB and −9 dB respectively. At −15 dB, peaks of harmonic distortion may be observed at 280 Hz and 105 Hz in plot 1000. Likewise, at −9 dB, the plots indicate peaks at 425 Hz, 420 Hz, and 260 Hz.

Once peak frequencies for a device are identified, the center frequencies of the notch and peak filters may be tuned to these identified dominant peak frequencies in an embodiment. FIGS. 11A-11B show plots 1100 and 1150 describing levels of harmonic distortion for a device (i.e., the same device as used for plots 1000 and 1050) at −15 and −9 DB respectively using a system for dynamic suppression of non-linear distortion for the device, such as volume modeling system 200. Plot 1100 shows reduced harmonic distortion, although a peak is still visible at 280 Hz. Since the loudness (i.e. tone strength) is less in plot 1100 compared to plot 1150, less aggressive suppression may be used. By contrast, plot 1150 does not show any peaks; the greater tone strength leads to more aggressive suppression of non-linear distortion.

Other methods may be used to select the notch and peak filter center frequencies. For example, the notch and peak filter center frequencies (and depths, in some embodiments) may be chosen based on the average distortion characteristic of a population of devices (e.g. 10, 20, or 100 devices). For example, the predetermined frequency for the multi-band limiter may be set at a frequency wherein harmonic distortion is greatest on average for a plurality of devices.

Figure 12:
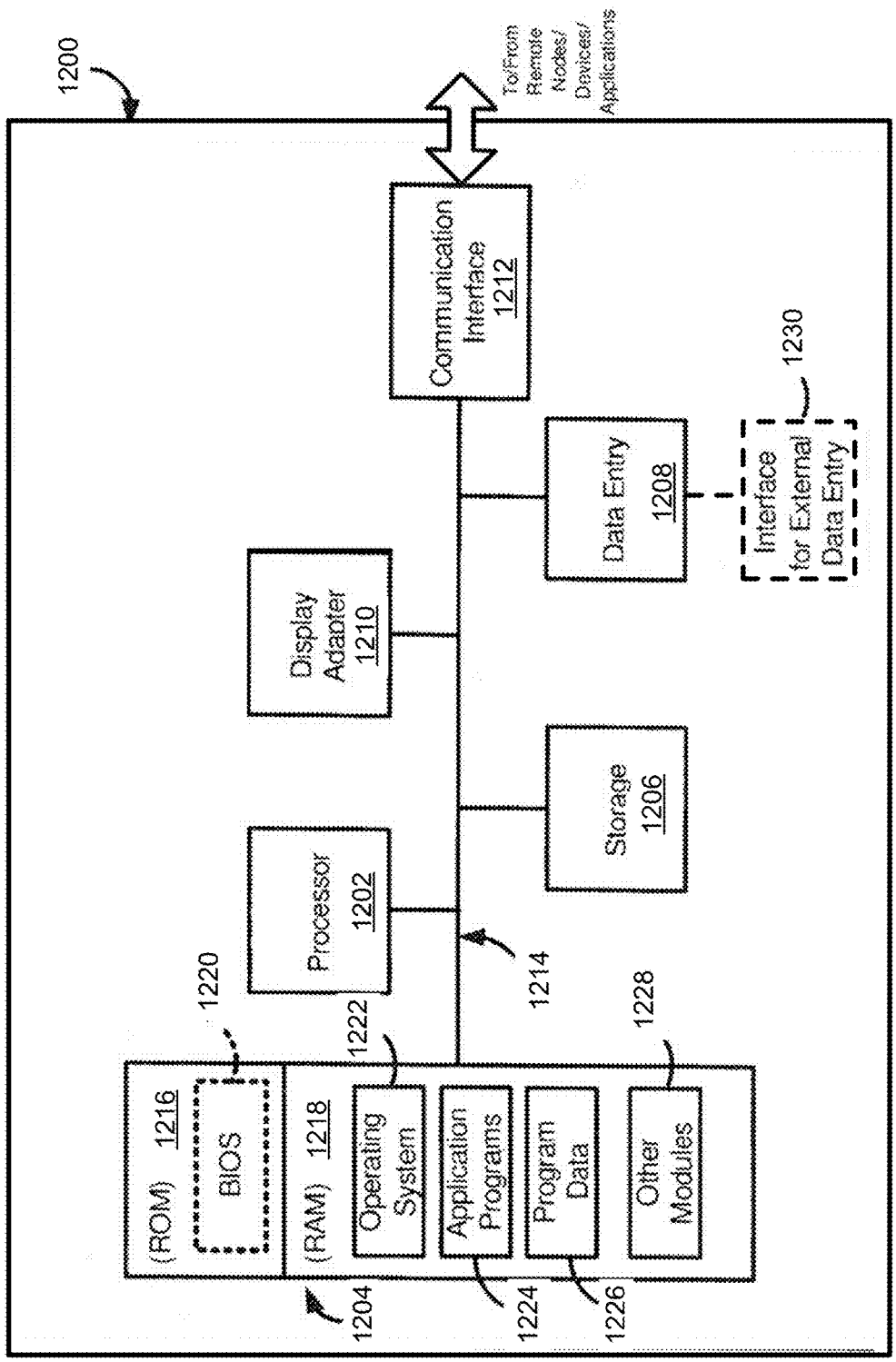
FIG. 12 is a block diagram of an exemplary system for providing dynamic suppression of non-linear distortion for a device, according to an embodiment.

FIG. 12 is a block diagram of an exemplary system for providing dynamic suppression of non-linear distortion for a device with various embodiments of the present invention. With reference to FIG. 12, an exemplary system for implementing the subject matter disclosed herein, including the methods described above, includes a hardware device 1200, including a processing unit 1202, memory 1204, storage 1206, data entry module 1208, display adapter 1210, communication interface 1212, and a bus 1214 that couples elements 1204-1212 to the processing unit 1202.

The bus 1214 may comprise any type of bus architecture. Examples include a memory bus, a peripheral bus, a local bus, etc. The processing unit 1202 is an instruction execution machine, apparatus, or device and may comprise a microprocessor, a digital signal processor, a graphics processing unit, an application specific integrated circuit (ASIC), a field programmable gate array (FPGA), etc. The processing unit 1202 may be configured to execute program instructions stored in memory 1204 and/or storage 1206 and/or received via data entry module 1208.

The memory 1204 may include read only memory (ROM) 1216 and random access memory (RAM) 1218. Memory 1204 may be configured to store program instructions and data during operation of device 1200. In various embodiments, memory 1204 may include any of a variety of memory technologies such as static random access memory (SRAM) or dynamic RAM (DRAM), including variants such as dual data rate synchronous DRAM (DDR SDRAM), error correcting code synchronous DRAM (ECC SDRAM), or RAIVIBUS DRAM (RDRAM), for example. Memory 1204 may also include nonvolatile memory technologies such as nonvolatile flash RAM (NVRAM) or ROM. In some embodiments, it is contemplated that memory 1204 may include a combination of technologies such as the foregoing, as well as other technologies not specifically mentioned. When the subject matter is implemented in a computer system, a basic input/output system (BIOS) 1220, containing the basic routines that help to transfer information between elements within the computer system, such as during start-up, is stored in ROM 1216.

The storage 1206 may include a flash memory data storage device for reading from and writing to flash memory, a hard disk drive for reading from and writing to a hard disk, a magnetic disk drive for reading from or writing to a removable magnetic disk, and/or an optical disk drive for reading from or writing to a removable optical disk such as a CD ROM, DVD or other optical media. The drives and their associated computer-readable media provide nonvolatile storage of computer readable instructions, data structures, program modules and other data for the hardware device 1200.

It is noted that the methods described herein can be embodied in executable instructions stored in a non-transitory computer readable medium for use by or in connection with an instruction execution machine, apparatus, or device, such as a computer-based or processor-containing machine, apparatus, or device. It will be appreciated by those skilled in the art that for some embodiments, other types of computer readable media may be used which can store data that is accessible by a computer, such as magnetic cassettes, flash memory cards, digital video disks, Bernoulli cartridges, RAM, ROM, and the like may also be used in the exemplary operating environment. As used here, a "computer-readable medium" can include one or more of any suitable media for storing the executable instructions of a computer program in one or more of an electronic, magnetic, optical, and electromagnetic format, such that the instruction execution machine, system, apparatus, or device can read (or fetch) the instructions from the computer readable medium and execute the instructions for carrying out the described methods. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

A number of program modules may be stored on the storage 1206, ROM 1216 or RAM 1218, including an operating system 1222, one or more applications programs 1224, program data 1226, and other program modules 1228. A user may enter commands and information into the hardware device 1200 through data entry module 1208. Data entry module 1208 may include mechanisms such as a keyboard, a touch screen, a pointing device, etc. Other external input devices (not shown) are connected to the hardware device 1200 via external data entry interface 1230. By way of example and not limitation, external input devices may include a microphone, joystick, game pad, satellite dish, scanner, or the like. In some embodiments, external input devices may include video or audio input devices such as a video camera, a still camera, etc. Data entry module 1208 may be configured to receive input from one or more users of device 1200 and to deliver such input to processing unit 1202 and/or memory 1204 via bus 1214.

The hardware device 1200 may operate in a networked environment using logical connections to one or more remote nodes (not shown) via communication interface 1212. The remote node may be another computer, a server, a router, a peer device or other common network node, and typically includes many or all of the elements described above relative to the hardware device 1200. The communication interface 1212 may interface with a wireless network and/or a wired network. Examples of wireless networks include, for example, a BLUETOOTH network, a wireless personal area network, a wireless 802.11 local area network (LAN), and/or wireless telephony network (e.g., a cellular, PCS, or GSM network). Examples of wired networks include, for example, a LAN, a fiber optic network, a wired personal area network, a telephony network, and/or a wide area network (WAN). Such networking environments are commonplace in intranets, the Internet, offices, enterprise-wide computer networks and the like. In some embodiments, communication interface 1212 may include logic configured to support direct memory access (DMA) transfers between memory 1204 and other devices.

In a networked environment, program modules depicted relative to the hardware device 1200, or portions thereof, may be stored in a remote storage device, such as, for example, on a server. It will be appreciated that other hardware and/or software to establish a communications link between the hardware device 1200 and other devices may be used.

It should be understood that the arrangement of hardware device 1200 illustrated in FIG. 12 is but one possible implementation and that other arrangements are possible. It should also be understood that the various system components (and means) defined by the claims, described above, and illustrated in the various block diagrams represent logical components that are configured to perform the functionality described herein. For example, one or more of these system components (and means) can be realized, in whole or in part, by at least some of the components illustrated in the arrangement of hardware device 1200. In addition, while at least one of these components are implemented at least partially as an electronic hardware component, and therefore constitutes a machine, the other components may be implemented in software, hardware, or a combination of software and hardware. More particularly, at least one component defined by the claims is implemented at least partially as an electronic hardware component, such as an instruction execution machine (e.g., a processor-based or processor-containing machine) and/or as specialized circuits or circuitry (e.g., discrete logic gates interconnected to perform a specialized function), such as those illustrated in FIG. 12. Other components may be implemented in software, hardware, or a combination of software and hardware. Moreover, some or all of these other components may be combined, some may be omitted altogether, and additional components can be added while still achieving the functionality described herein. Thus, the subject matter described herein can be embodied in many different variations, and all such variations are contemplated to be within the scope of what is claimed.

In the description above, the subject matter may be described with reference to acts and symbolic representations of operations that are performed by one or more devices, unless indicated otherwise. As such, it will be understood that such acts and operations, which are at times referred to as being computer-executed, include the manipulation by the processing unit of data in a structured form. This manipulation transforms the data or maintains it at locations in the memory system of the computer, which reconfigures or otherwise alters the operation of the device in a manner well understood by those skilled in the art. The data structures where data is maintained are physical locations of the memory that have particular properties defined by the format of the data. However, while the subject matter is being described in the foregoing context, it is not meant to be limiting as those of skill in the art will appreciate that various of the acts and operation described hereinafter may also be implemented in hardware.

For purposes of the present description, the terms "component," "module," and "process," may be used interchangeably to refer to a processing unit that performs a particular function and that may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

In the description above and throughout, numerous specific details are set forth in order to provide a thorough understanding of the disclosure. It will be evident, however, to one of ordinary skill in the art, that the disclosure may be practiced without these specific details. In other instances, well-known structures and devices are shown in block diagram form to facilitate explanation. The description of the preferred an embodiment is not intended to limit the scope of the claims appended hereto. Further, in the methods disclosed herein, various steps are disclosed illustrating some of the functions of the disclosure. One will appreciate that these steps are merely exemplary and are not meant to be limiting in any way. Other steps and functions may be contemplated without departing from this disclosure.

A method is described for dynamically suppressing non-linear distortion for a device, such as a speakerphone. A multi-band limiter may receive a signal, and split the received signal into a plurality of bands. The splitting may be performed using a notch filter and a peak filter, each filter having a center frequency tuned to a predetermined frequency for the device, each filter filtering one of the plurality of bands. Both a tone strength parameter and a band level of each filtered band of the received signal may be computed by, for example, an analysis circuit coupled to the multi-band limiter. Limiter target output levels may be set for a plurality of limiters, each limiter receiving a filtered band of the received signal from a filter. Each limiter target output level may be set such that suppression of the non-linear distortion is reduced when the tone strength parameter is in a lower portion of a predetermined range and suppression of the non-linear distortion is increased when the tone strength parameter is in an upper portion of the predetermined range. The predetermined range of the tone strength parameter may correspond to a loudness range of the device. The multi-band limiter may then limit the output of each filter by each of the limiters based on the set limiter target output levels. The outputs of each of the limiters may be combined to provide a processed signal as an output of the multi-band limiter.

In an embodiment, the band level of each filtered band of the received signal is the energy of the filtered band and the tone strength parameter is equal to a ratio between an energy of an output of the peak filter at the predetermined frequency and an energy of an output of the notch filter at the predetermined frequency. The target output level for each limiter may be set by computing mapping parameters to map the computed tone strength parameter to the limiter target output level, the mapping parameters being directly proportional to the computed band level of the filtered band and being based on the computed band level and the computed tone strength. The limiter target output level for each limiter may be set based on the computed band level and the computed mapping parameters. In a further embodiment, the limiter target output level for each limiter may be equal to a sum of the negation of the computed band level of the filtered band, a predetermined headroom value, and a depth parameter, the depth parameter falling within a predetermined range and being related to the computed band level of the filtered band.

Additional embodiments may include receiving an input signal and a volume gain, the input signal having a loudness parameter, the volume gain corresponding to a desired gain level. Dynamic filters may be applied to the received input signal based on the loudness parameter and the volume gain, wherein the dynamic filters attenuate a low-frequency band of the input signal and a high-frequency band of the input signal in response to an increase the loudness parameter. Additionally, the dynamic filters may boost the low-frequency band and the high-frequency band in response to a decrease in the loudness parameter, and the output of the dynamic filters may be the signal received by the multi-band limiter.

In a further embodiment, the splitting the received signal may include splitting the received signal into three bands using two notch filters paired with two peak filters, each notch filter and peak filter pair being set to a predetermined frequency, both notch filters filtering one band, and each peak filter filtering a separate band, wherein the plurality of limiters comprises two limiters, each limiter limiting a separate band received from a peak filter. Furthermore, the splitting the received signal may include splitting the received signal into a plurality of bands using N notch filters paired with N peak filters, wherein N is greater than two. Each notch filter and peak filter pair may be set to a predetermined center frequency. The N notch filters may filter a single band, and each peak filter may filter a separate band of the received signal. The plurality of limiters may include N limiters, each limiter limiting a separate band received from a peak filter in the manner described above (e.g., using a computed target output value derived using a mapping function).

Determining the frequency for the device may be performed in numerous different ways. In an embodiment, the predetermined frequency for the device may be determined by playing swept tones on the device within a predetermined frequency range at a plurality of different tone strengths, and recording levels of harmonic distortion of recordings made of the device for each played swept tone. A frequency may be identified within the predetermined frequency range wherein the recorded levels of harmonic distortion have a peak. Each of the notch filter and the peak filter may be tuned by setting the center frequency of each filter to the identified frequency. In another embodiment, the predetermined frequency for the device is set at a frequency wherein harmonic distortion is greatest on average for a plurality of devices.

A computer program product is described for dynamically suppressing non-linear distortion for a device. The computer program product may include computer-readable program code to be executed by one or more processors when retrieved from a non-transitory computer-readable medium, the program code including instructions to perform the following steps. A multi-band limiter may receive a signal, and split the received signal into a plurality of bands. The splitting may be performed using a notch filter and a peak filter, each filter having a center frequency tuned to a predetermined frequency for the device, each filter filtering one of the plurality of bands. Both a tone strength parameter and a band level of each filtered band of the received signal may be computed by, for example, an analysis circuit coupled to the multi-band limiter. Limiter target output levels may be set for a plurality of limiters, each limiter receiving a filtered band of the received signal from a filter. Each limiter target output level may be set such that suppression of the non-linear distortion is reduced when the tone strength parameter is in a lower portion of a predetermined range and suppression of the non-linear distortion is increased when the tone strength parameter is in an upper portion of the predetermined range. The predetermined range of the tone strength parameter may correspond to a loudness range of the device. The multi-band limiter may then limit the output of each filter by each of the limiters based on the set limiter target output levels. The outputs of each of the limiters may be combined to provide a processed signal as an output of the multi-band limiter.

In an embodiment, the band level of each filtered band of the received signal is the energy of the filtered band and the tone strength parameter is equal to a ratio between an energy of an output of the peak filter at the predetermined frequency and an energy of an output of the notch filter at the predetermined frequency. The target output level for each limiter may be set by computing mapping parameters to map the computed tone strength parameter to the limiter target output level, the mapping parameters being directly proportional to the computed band level of the filtered band and being based on the computed band level and the computed tone strength. The limiter target output level for each limiter may be set based on the computed band level and the computed mapping parameters. In a further embodiment, the limiter target output level for each limiter may be equal to a sum of the negation of the computed band level of the filtered band, a predetermined headroom value, and a depth parameter, the depth parameter falling within a predetermined range and being related to the computed band level of the filtered band.

Additional embodiments may include instructions to receive an input signal and a volume gain, the input signal having a loudness parameter, the volume gain corresponding to a desired gain level. Dynamic filters may be applied to the received input signal based on the loudness parameter and the volume gain, wherein the dynamic filters attenuate a low-frequency band of the input signal and a high-frequency band of the input signal in response to an increase the loudness parameter. Additionally, the dynamic filters may boost the low-frequency band and the high-frequency band in response to a decrease in the loudness parameter, and the output of the dynamic filters may be the signal received by the multi-band limiter.

In a further embodiment, the splitting the received signal may include splitting the received signal into three bands using two notch filters paired with two peak filters, each notch filter and peak filter pair being set to a predetermined frequency, both notch filters filtering one band, and each peak filter filtering a separate band, wherein the plurality of limiters comprises two limiters, each limiter limiting a separate band received from a peak filter.

Determining the frequency for the device may be performed in numerous different ways. In an embodiment, further instructions to determine the predetermined frequency for the device may play swept tones on the device within a predetermined frequency range at a plurality of different tone strengths, and recording levels of harmonic distortion of recordings made of the device for each played swept tone. A frequency may be identified within the predetermined frequency range wherein the recorded levels of harmonic distortion have a peak. Each of the notch filter and the peak filter may be tuned by setting the center frequency of each filter to the identified frequency. In another embodiment, the predetermined frequency for the device is set at a frequency wherein harmonic distortion is greatest on average for a plurality of devices.

A system is described for dynamically suppressing non-linear distortion for a device. The system may include a multi-band limiter circuit, the multi-band limiter circuit receiving a signal, and splitting the received signal into a plurality of bands using a notch filter and a peak filter. Each filter may have a center frequency tuned to a predetermined frequency for the device, and may filter one of the plurality of bands. The multi-band limiter circuit may also limit the output of each filter by each of a plurality of limiters based on set limiter target output levels, and combine the outputs of each of the limiters to provide a processed signal as an output. The system may also include an analysis circuit coupled to the multi-band limiter circuit, the analysis circuit computing both a tone strength parameter and a band level of each filtered band of signal received by the multi-band limiter circuit. The analysis circuit may also set limiter target output levels for the plurality of limiters of the multi-band limiter circuit, where each limiter receives a filtered band of the received signal from a filter. Each limiter target output level may be set such that suppression of the non-linear distortion is reduced when the tone strength parameter is in a lower portion of a predetermined range and suppression of the non-linear distortion is increased when the tone strength parameter is in an upper portion of a predetermined range, the predetermined range of the tone strength parameter corresponding to the loudness range of the device.

In an embodiment, the band level of each filtered band of the received signal is the energy of the filtered band and the tone strength parameter is equal to a ratio between an energy of an output of the peak filter at the predetermined frequency and an energy of an output of the notch filter at the predetermined frequency. The target output level for each limiter may be set by computing mapping parameters to map the computed tone strength parameter to the limiter target output level, the mapping parameters being directly proportional to the computed band level of the filtered band and being based on the computed band level and the computed tone strength. The limiter target output level for each limiter may be set based on the computed band level and the computed mapping parameters. In a further embodiment, the limiter target output level for each limiter may be equal to a sum of the negation of the computed band level of the filtered band, a predetermined headroom value, and a depth parameter, the depth parameter falling within a predetermined range and being related to the computed band level of the filtered band.

Additional embodiments of the system may include a shelf filter coupled to both the multi-band limiter circuit and the analysis circuit. The shelf filter may receive an input signal and a volume gain, the input signal having a loudness parameter, the volume gain corresponding to a desired gain level. Dynamic filters may be applied by the shelf filter to the received input signal based on the loudness parameter and the volume gain, wherein the dynamic filters attenuate a low-frequency band of the input signal and a high-frequency band of the input signal in response to an increase the loudness parameter. Additionally, the dynamic filters may boost the low-frequency band and the high-frequency band in response to a decrease in the loudness parameter, and the output of the dynamic filters may be the signal received by the multi-band limiter.

In a further embodiment, the splitting the received signal may include splitting the received signal into three bands using two notch filters paired with two peak filters, each notch filter and peak filter pair being set to a predetermined frequency, both notch filters filtering one band, and each peak filter filtering a separate band, wherein the plurality of limiters comprises two limiters, each limiter limiting a separate band received from a peak filter. Also, the predetermined frequency for the device may be set at a frequency wherein harmonic distortion is greatest on average for a plurality of devices.

A method is described for dynamically suppressing non-linear distortion for a device. A signal may be received on the device, the device having non-linear distortion at a pre-determined frequency. The received signal may be analyzed to identify a tone strength parameter and a band level of the received signal. The received signal may be filtered such that the spectrum of the input signal is dynamically limited by reducing suppression of the non-linear distortion when the tone strength parameter is in a lower portion of a predetermined range and increasing suppression of the non-linear distortion when the tone strength parameter is in an upper portion of the predetermined range, the predetermined range of the tone strength parameter corresponding to a loudness range of the device.

What is claimed is:

1. A method for providing dynamic suppression of non-linear distortion for a device, the method comprising:
    receiving a signal by a multi-band limiter;
    splitting the received signal, by the multi-band limiter, into a plurality of bands using a notch filter and a peak filter, each filter having a center frequency tuned to a predetermined frequency for the device, each filter filtering one of the plurality of bands;
    computing both a tone strength parameter and a band level for each center frequency;
    setting limiter target output levels for a plurality of limiters, each limiter receiving a filtered band of the received signal from the filters, each limiter target output level being set such that suppression of the non-linear distortion is reduced when the tone strength parameter is in a lower portion of a predetermined strength range and suppression of the non-linear distortion is increased when the tone strength parameter is in an upper portion of the predetermined strength range, the predetermined strength range corresponding to a loudness range of the device;
    limiting, by the multi-band limiter, the outputs of the filters using the plurality of limiters, the limiting of each filter output being based on the set limiter target output levels for each limiter; and
    combining the outputs of the limiters, thereby providing a processed signal as an output of the multi-band limiter.

2. The method of claim 1, wherein the band level is equal to an energy of an output of the peak filter at the predetermined frequency, and wherein the tone strength parameter is equal to a ratio between the energy of the output of the peak filter at the predetermined frequency and an energy of an output of the notch filter at the predetermined frequency, wherein the target output level for each limiter is set by:
    computing mapping parameters to map the computed tone strength parameter to the limiter target output level, the mapping parameters being directly proportional to the computed band level and being based on the computed band level and the computed tone strength; and
    setting the limiter target output level for each limiter based on the computed band level and the computed mapping parameters.

3. The method of claim 2, the limiter target output level for each limiter being equal to a sum of the negation of the computed band level, a predetermined headroom value, and a depth parameter, the depth parameter falling within a predetermined depth range and being related to the computed band level.

4. The method of claim 1, further comprising:
    receiving an input signal and a volume gain, the input signal having a loudness parameter, the volume gain corresponding to a desired gain level; and
    applying dynamic filters to the received input signal based on the loudness parameter and the volume gain, wherein the dynamic filters attenuate a low-frequency band of the input signal and a high-frequency band of the input signal in response to an increase the loudness parameter and the dynamic filters boost the low-frequency band and the high-frequency band in response to a decrease in the loudness parameter, the output of the dynamic filters being the signal received by the multi-band limiter.

5. The method of claim 1, wherein the splitting the received signal comprises splitting the received signal into three bands using two notch filters paired with two peak filters, each notch filter and peak filter pair being set to different predetermined frequencies, both notch filters filtering one band, and each peak filter filtering a separate band, wherein the plurality of limiters comprises two limiters, each limiter limiting a separate band received from the peak filters.

6. The method of claim 1, further comprising determining the predetermined frequency for the device by:
    playing swept tones on the device within a predetermined frequency range at a plurality of different tone strengths;

recording levels of harmonic distortion of recordings made of the device for each played swept tone;

identifying a frequency within the predetermined frequency range wherein the recorded levels of harmonic distortion have a peak; and tuning each of the notch filter and the peak filter by setting the center frequency of each filter to the identified frequency.

7. The method of claim 1, wherein the predetermined frequency for the device is set at a frequency wherein harmonic distortion is greatest on average for a plurality of devices.

8. The method of claim 1, wherein the splitting the received signal comprises splitting the received signal into a plurality of bands using N notch filters paired with N peak filters, wherein N is greater than two, each notch filter and peak filter pair being set to different predetermined frequencies, the N notch filters filtering a single band, and each peak filter filtering a separate band of the received signal, wherein the plurality of limiters comprises N limiters, each limiter limiting a separate band received from the peak filters.

9. A computer program product comprising computer-readable program code to be executed by one or more processors when retrieved from a non-transitory computer-readable medium, the program code including instructions to:

receive a signal by a multi-band limiter;

split the received signal, by the multi-band limiter, into a plurality of bands using a notch filter and a peak filter, each filter having a center frequency tuned to a predetermined frequency for the device, each filter filtering one of the plurality of bands;

compute both a tone strength parameter and a band level for each center frequency;

set limiter target output levels for a plurality of limiters, each limiter receiving a filtered band of the received signal from the filters, each limiter target output level being set such that suppression of the non-linear distortion is reduced when the tone strength parameter is in a lower portion of a predetermined strength range and suppression of the non-linear distortion is increased when the tone strength parameter is in an upper portion of a predetermined strength range, the predetermined strength range corresponding to the loudness range of the device;

limit, by the multi-band limiter, the outputs of the filters using the plurality of limiters, the limiting of each filter output being based on the set limiter target output levels for each limiter; and combine the outputs of the limiters, thereby providing a processed signal as an output of the multi-band limiter.

10. The computer program product of claim 9, wherein the band level is equal to an energy of an output of the peak filter at the predetermined frequency, and wherein the tone strength parameter is equal to a ratio between the energy of the output of the peak filter at the predetermined frequency and an energy of an output of the notch filter at the predetermined frequency, wherein the target output level for each limiter is set by:

compute mapping parameters to map the computed tone strength parameter to the limiter target output level, the mapping parameters being directly proportional to the computed band level and being based on the computed band level and the computed tone strength; and setting the limiter target output level for each limiter based on the computed band level and the computed mapping parameters.

11. The computer program product of claim 10, the limiter target output level for each limiter being equal to a sum of the negation of the computed band level, a predetermined headroom value, and a depth parameter, the depth parameter falling within a predetermined depth range and being related to the computed band level.

12. The computer program product of claim 9, the program code further including instructions to:

receive an input signal and a volume gain, the input signal having a loudness parameter, the volume gain corresponding to a desired gain level; and apply dynamic filters to the received input signal based on the loudness parameter and the volume gain, wherein the dynamic filters attenuate a low-frequency band of the input signal and a high-frequency band of the input signal in response to an increase the loudness parameter and the dynamic filters boost the low-frequency band and the high-frequency band in response to a decrease in the loudness parameter, the output of the dynamic filters being the signal received by the multi-band limiter.

13. The computer program product of claim 9, wherein the instructions to split the received signal include instructions to split the received signal into three bands using two notch filters paired with two peak filters, each notch filter and peak filter pair being set to different predetermined frequencies, both notch filters filtering one band, and each peak filter filtering a separate band, wherein the plurality of limiters comprises two limiters, each limiter limiting a separate band received from the peak filters.

14. The computer program product of claim 9, the program code further including instructions to:

play swept tones on the device within a predetermined frequency range at a plurality of different tone strengths;

record levels of harmonic distortion of recordings made of the device for each played swept tone;

identify a frequency within the predetermined frequency range wherein the recorded levels of harmonic distortion have a peak; and tune each of the notch filter and the peak filter by setting the center frequency of each filter to the identified frequency.

15. The computer program product of claim 9, wherein the predetermined frequency for the device is set at a frequency wherein harmonic distortion is greatest on average for a plurality of devices.

16. A system comprising, a multi-band limiter circuit, the multi-band limiter circuit receiving a signal, splitting the received signal into a plurality of bands using a notch filter and a peak filter, each filter having a center frequency tuned to a predetermined frequency for the device, each filter filtering one of the plurality of bands, limiting the output of the filters using a plurality of limiters, the limiting of each filter output being based on set limiter target output levels for each limiter, and combining the outputs of the limiters to provide a processed signal as an output; and an analysis circuit coupled to the multi-band limiter circuit, where the analysis circuit computes both a tone strength parameter and a band level for each center frequency, and sets limiter target output levels for the plurality of limiters, each limiter receiving a filtered band of the received signal from the filters, each limiter target output level being set such that suppression of the non-linear distortion is reduced when the tone strength parameter is in a lower portion of a predetermined strength range and suppression of the non-linear distortion is increased when the tone strength parameter is in an upper portion of the predetermined strength range, the predetermined strength range corresponding to the loudness range of the device.

17. The system of claim 16, wherein the band level is equal to an energy of an output of the peak filter at the predetermined frequency, and wherein the tone strength parameter is equal to a ratio between the energy of the output of the peak filter at the predetermined frequency and an energy of an output of the notch filter at the predetermined frequency, wherein the target output level for each limiter is set by:
  computing mapping parameters to map the computed tone strength parameter to the limiter target output level, the mapping parameters being directly proportional to the computed band level and being based on the computed band level and the computed tone strength; and
  setting the limiter target output level for each limiter based on the computed band level and the computed mapping parameters.

18. The system of claim 17, the limiter target output level for each limiter being equal to a sum of the negation of the computed band level, a predetermined headroom value, and a depth parameter, the depth parameter falling within a predetermined depth range and being related to the computed band level.

19. The system of claim 16, further comprising a shelf filter coupled to both the multi-band limiter circuit and the analysis circuit, the shelf filter receiving an input signal and a volume gain, the input signal having a loudness parameter, the volume gain corresponding to a desired gain level, and applies dynamic filters to the received input signal based on the loudness parameter and the volume gain, wherein the dynamic filters attenuate a low-frequency band of the input signal and a high-frequency band of the input signal in response to an increase the loudness parameter and the dynamic filters boost the low-frequency band and the high-frequency band in response to a decrease in the loudness parameter, the output of the dynamic filters being the signal received by the multi-band limiter.

20. The system of claim 16, wherein the splitting the received signal comprises splitting the received signal into three bands using two notch filters paired with two peak filters, each notch filter and peak filter pair being set to different predetermined frequencies, both notch filters filtering one band, and each peak filter filtering a separate band, wherein the plurality of limiters comprises two limiters, each limiter limiting a separate band received from the peak filters.

21. The system of claim 16, wherein the predetermined frequency for the device is set at a frequency wherein harmonic distortion is greatest on average for a plurality of devices.

22. A method for providing dynamic suppression of non-linear distortion, the method comprising:
  receiving a signal on a device, the device having non-linear distortion at a pre-determined frequency;
  splitting the received signal using a filter bank into a plurality of signal bands;
  analyzing the received signal to identify a tone strength parameter and a band level of the signal band including the predetermined frequency; and
  filtering the received signal such that a spectrum of the input signal is dynamically limited by reducing suppression of the signal band including the predetermined frequency when the tone strength parameter is in a lower portion of a predetermined range and increasing suppression of the signal band including the predetermined frequency when the tone strength parameter is in an upper portion of the predetermined range, the predetermined range of the tone strength parameter corresponding to a loudness range of the device.

* * * * *